(12) United States Patent
Dold et al.

(10) Patent No.: US 11,365,093 B2
(45) Date of Patent: Jun. 21, 2022

(54) METHOD AND DEVICE FOR DETECTING A DETERIORATION STATE IN A SUSPENSION MEMBER ARRANGEMENT FOR AN ELEVATOR BASED ON AC VOLTAGE MEASUREMENTS WITH SUSPENSION MEMBERS BEING ELECTRICALLY SHORT-CIRCUITED AT THEIR DISTAL ENDS

(71) Applicant: Inventio AG, Hergiswil (CH)

(72) Inventors: Florian Dold, Bremgarten (CH); Philippe Henneau, Zürich (CH)

(73) Assignee: INVENTIO AG, Hergiswil (CH)

( * ) Notice: Subject to any disclaimer, the term of this patent is extended or adjusted under 35 U.S.C. 154(b) by 983 days.

(21) Appl. No.: 16/077,113

(22) PCT Filed: Jan. 31, 2017

(86) PCT No.: PCT/EP2017/052064
§ 371 (c)(1),
(2) Date: Aug. 10, 2018

(87) PCT Pub. No.: WO2017/137282
PCT Pub. Date: Aug. 17, 2017

(65) Prior Publication Data
US 2019/0047822 A1 Feb. 14, 2019

(30) Foreign Application Priority Data
Feb. 11, 2016 (EP) ...................................... 16155357

(51) Int. Cl.
*D07B 1/14* (2006.01)
*G01R 31/00* (2006.01)
(Continued)

(52) U.S. Cl.
CPC .............. *B66B 7/1223* (2013.01); *B66B 5/00* (2013.01); *B66B 5/0018* (2013.01); *B66B 7/062* (2013.01);
(Continued)

(58) Field of Classification Search
CPC ....... B66B 7/1223; B66B 5/00; B66B 5/0018; B66B 7/062; B66B 7/085; B66B 7/1215;
(Continued)

(56) References Cited

U.S. PATENT DOCUMENTS 6,828,771 B1 12/2004 Ghassemi
7,123,030 B2 10/2006 Robar et al.
(Continued)

FOREIGN PATENT DOCUMENTS

CN 101456509 A 6/2009
CN 103910267 A 7/2014
(Continued)

OTHER PUBLICATIONS

Lei, Huaming et al. "Health Monitoring for Coated Steel Belts in an Elevator System." Journal of Sensors Volume 2012, Article ID 750261, 5 pages, http://dx.doi.org/10.1155/2012/750261.

*Primary Examiner* — Tung X Nguyen
*Assistant Examiner* — Feba Pothen
(74) *Attorney, Agent, or Firm* — William J. Clemens; Shumaker, Loop & Kendrick, LLP

(57) ABSTRACT

A method for detecting a deterioration state in an elevator suspension member including electrically conductive cords uses a multiplexing unit (MU) to apply first and second alternating voltages to proximal ends of first and second groups of the cords respectively and connect the proximal end of a third group of the cords to a voltage measurement arrangement connected to a reference potential. Distal ends of the groups are connected together. A first neutral point
(Continued)

voltage between the third proximal end and the reference potential is determined. The MU is switched to apply the first alternating voltage to the second proximal end, apply the second alternating voltage to the third proximal end and determine a second neutral point voltage between the first proximal end and the reference potential. The deterioration state of the suspension member arrangement is determined based on the first and second neutral point voltages.

11 Claims, 4 Drawing Sheets

(51) Int. Cl.
    *B66B 5/00*       (2006.01)
    *G01R 31/08*     (2020.01)
    *B66B 7/06*       (2006.01)
    *B66B 7/12*       (2006.01)
    *B66B 7/08*       (2006.01)
    *B66B 19/00*     (2006.01)
    *G01R 31/317*    (2006.01)
    *G01M 5/00*      (2006.01)
    *G01N 27/20*     (2006.01)

(52) U.S. Cl.
    CPC .......... *B66B 7/085* (2013.01); *B66B 7/1215* (2013.01); *B66B 19/007* (2013.01); *D07B 1/145* (2013.01); *G01M 5/0033* (2013.01); *G01M 5/0091* (2013.01); *G01N 27/20* (2013.01); *G01R 31/008* (2013.01); *G01R 31/081* (2013.01); *G01R 31/31723* (2013.01); *D07B 2501/2007* (2013.01); *D10B 2401/16* (2013.01); *G01R 31/08* (2013.01)

(58) Field of Classification Search
CPC ............. B66B 19/007; D07B 1/145; D07B 2501/2007; G01M 5/0033; G01M 5/0091; G01N 27/20; G01R 31/008; G01R 31/081; G01R 31/31723; G01R 31/08; D10B 2401/16

See application file for complete search history.

(56) References Cited

U.S. PATENT DOCUMENTS

| | | | |
|---|---|---|---|
| 8,011,479 B2 | 9/2011 | Stucky et al. | |
| 8,424,653 B2 | 4/2013 | Stucky et al. | |
| 9,927,384 B2* | 3/2018 | Lehtinen | B66B 7/1223 |
| 9,932,203 B2 | 4/2018 | Robibero | |
| 2007/0180925 A1* | 8/2007 | Stucky | G01N 27/20 |
| | | | 73/810 |
| 2008/0223668 A1 | 9/2008 | Stucky et al. | |
| 2011/0210750 A1* | 9/2011 | Medelius | H01B 1/24 |
| | | | 324/543 |
| 2011/0284331 A1 | 11/2011 | Stucky et al. | |
| 2013/0207668 A1 | 8/2013 | Fargo et al. | |
| 2015/0060209 A1* | 3/2015 | Nikander | H02M 1/4208 |
| | | | 187/276 |
| 2016/0002006 A1 | 1/2016 | Sun et al. | |

FOREIGN PATENT DOCUMENTS

| | | |
|---|---|---|
| DE | 19708518 A1 | 10/1998 |
| EP | 1730066 B1 | 10/2010 |
| EP | 1732837 B1 | 4/2011 |
| JP | H0891734 A | 4/1996 |
| WO | 2005095250 A1 | 10/2005 |
| WO | 2011098847 A1 | 8/2011 |
| WO | 2013135285 A1 | 9/2013 |
| WO | 2014083043 A1 | 6/2014 |
| WO | 2014130028 A1 | 8/2014 |
| WO | 2014130029 A1 | 8/2014 |
| WO | 2017021263 A1 | 9/2017 |

* cited by examiner

METHOD AND DEVICE FOR DETECTING A DETERIORATION STATE IN A SUSPENSION MEMBER ARRANGEMENT FOR AN ELEVATOR BASED ON AC VOLTAGE MEASUREMENTS WITH SUSPENSION MEMBERS BEING ELECTRICALLY SHORT-CIRCUITED AT THEIR DISTAL ENDS

FIELD

The present invention relates to a method and a device for detecting a deterioration state in a suspension member arrangement for an elevator.

BACKGROUND

Elevators typically comprise a car and, optionally, a counterweight which may be displaced for example within an elevator shaft or hoistway to different levels in order to transport persons or items for example to various floors within a building. In a common type of elevator, the car and/or the counterweight are supported by a suspension member arrangement comprising one or more suspension members. A suspension member may be a member which may carry heavy loads in a tension direction and which may be bent in a direction transverse to the tension direction. For example, a suspension member may be a rope or a belt. Typically, suspension members comprise a plurality of load carrying cords. The cords may be made for example with an electrically conductive material, particularly a metal such as steel.

During operation of the elevator, suspension members have to carry high loads and are typically repeatedly bent when running along for example a traction sheave, a pulley and/or other types of sheaves. Accordingly, substantial physical stress is applied to the suspension member arrangement during operation which may lead to deteriorations in the suspension members' physical characteristics such as e.g. their load bearing capability.

However, as elevators may typically be used by people for transportation along significant heights, safety requirements have to be fulfilled. For example, it has to be safeguarded that the suspension member arrangement can always guarantee safe support of the car and/or the counterweight. For such purposes, safety regulations rule for example that any substantial deterioration of an initial load bearing capacity of a suspension member arrangement can be detected such that for example counter-measures such as replacing a substantially deteriorated or faulty suspension member from the suspension member arrangement may be initiated.

For example, elevator load bearing member wear and failure detection has been described in EP 1 730 066 B1. A method and apparatus for detecting elevator rope degradation using electrical resistance is described in U.S. Pat. No. 7,123,030 B2. Electrical signal application strategies for monitoring a condition of an elevator load bearing member are described in US 2011/0284331 A1 and U.S. Pat. No. 8,424,653 B2. Electrical signal application strategies for monitoring a condition of an elevator load bearing member are described in US 2008/0223668 A1 and U.S. Pat. No. 8,011,479 B2. A simplified resistance based belt type suspension inspection is disclosed in US 2013/0207668 A1. An elevator system belt type suspension having connecting devices attached thereto is described in WO 2011/098847 A1. A method for detection of wear or failure in a load bearing member of an elevator is described in WO 2013/135285 A1. Electrical signal application strategies for monitoring a condition of an elevator load bearing member are described in EP 1 732 837 B1. "Health Monitoring for Coated Steel Belts in an Elevator System" have been described in a research article of Huaming Lei et al. in the Journal of Sensors, Volume 2012, Article ID 750261, 5 pages, doi: 10.1155/2012/750261. Most of these prior art approaches are generally based on measuring electrical resistance characteristics upon applying an electrical direct current (DC).

Further approaches for methods and devices for detecting deteriorations in load bearing suspension members of an elevator have been proposed by the present applicant, these approaches relying on AC voltage measurements. These approaches have been described by the present applicant in PCT/EP2016/067966, EP 16155357.3 and EP 16155358.1, herein later on referred to as "the applicant's prior art". Furthermore, the applicant of the present application has filed a US provisional application U.S. 62/199,375 and a US non-provisional application U.S. Ser. No. 14/814,558 which relate to a more generalized approach for determining deteriorations in a suspension member arrangement for an elevator and which are also included in the "applicant's prior art".

It shall be emphasized that many technical details of the "applicant's prior art" may also be applied to the present invention and that some technical characteristics of the present invention may be better understood upon studying "the applicant's prior art". Accordingly, the content of the "applicant's prior art" shall be incorporated herein by reference.

SUMMARY

There may be a need for an alternative method and device for detecting a deterioration state in a suspension member arrangement for an elevator. Particularly, there may be a need for such method and device which enables fulfilling high safety requirements, simple implementation and/or low cost.

According to a first aspect of the invention, a method for detecting a deterioration state in a suspension member arrangement for an elevator is proposed. Therein, the suspension member arrangement comprises at least one suspension member having at least a first, a second and a third group of electrically conductive cords. Each of the groups of cords has opposite proximal and distal ends. At least a first one and a second one of the proximal ends of the first, second and third group of electrically conductive cords are electrically connectable via a multiplexing unit to an alternating voltage generator arrangement comprising a first voltage generator for applying a first alternating voltage $U_1$ and a second voltage generator for applying a second alternating voltage $U_2$. At least a third one of the proximal ends of the first, second and third group of electrically conductive cords is electrically connectable via the multiplexing unit to a voltage measurement arrangement. The voltage measurement arrangement is configured for determining voltages $U_n$ between the third proximal end and an electrical reference potential. Distal ends of the first, second and third group of electrically conductive cords are electrically connected to each other via a bridge interconnection, i.e. via an electrically highly conductive interconnector which short-circuits the distal ends.

The method comprises the following steps: (i) in a first configuration of the multiplexing unit, the first alternating voltage $U_1$ is applied to the first proximal end and the second alternating voltage $U_2$ is applied to the second proximal end, and a first neutral point voltage $U_{n1}$ between the third proximal end and the electrical reference potential is determined; (ii) the multiplexing unit is then switched to a second configuration in which the first alternating voltage $U_1$ is applied to the second proximal end and the second alternating voltage $U_2$ is applied to the third proximal end, and a second neutral point voltage $U_{n2}$ between the first proximal end and the electrical reference potential is determined; (iii) finally, the deterioration state of the suspension member arrangement is determined based on the first and second neutral point voltages $U_{n1}$, $U_{n2}$.

According to a second aspect of the invention, a detection device for detecting a deterioration state in a suspension member arrangement for an elevator is proposed. Therein, the suspension member arrangement comprises at least one suspension member having at least a first, a second and a third group of electrically conductive cords. Distal ends of the first, second and third group of electrically conductive cords are electrically connected to each other via a bridge interconnection. The detection device comprises (a) an alternating voltage generator arrangement comprising a first voltage generator for generating a first alternating voltage $U_1$ and a second voltage generator for generating a second alternating voltage $U_2$; (b) a voltage measurement arrangement for measuring neutral point voltages $U_n$ between one of proximal ends of the first, second and third group of electrically conductive cords and an electrical reference potential; (c) a multiplexing unit for selectively connecting at least a first one and a second one of the proximal ends of the first, second and third group of electrically conductive cords to the first voltage generator and the second voltage generator, respectively, and for selectively connecting at least a third one of the proximal ends of the first, second and third group of electrically conductive cords to the voltage measurement arrangement; and (d) an evaluation unit for detecting the deterioration state based on measured neutral point voltages $U_n$.

Particularly, the detection device may be adapted for performing the method according to an embodiment of the first aspect of the invention.

According to a third aspect of the invention, an elevator arrangement is proposed. The elevator arrangement comprises a suspension member arrangement comprising at least one suspension member having at least a first, a second and a third group of electrically conductive cords. The elevator arrangement further comprises a detection device according to an embodiment of the second aspect of the invention for detecting a deterioration state in a suspension member arrangement.

Without restricting the scope of the invention in any way, ideas underlying embodiments of the invention may be understood as being based, inter alia, on the following recognitions and observations:

In conventional approaches for detecting a deterioration state of a load bearing capacity in a suspension member arrangement such as some of those approaches indicated in the above introductory portion, electrical characteristics of cords included in a suspension member have been taken as indicators for changes in the deterioration state. Generally, electrical resistances within the cords have been measured and it has been assumed that an increase of such electrical resistances indicates a deterioration of the load bearing capacity of the suspension member.

However, such electrical resistance measurements, or alternatively impedance measurements, may require substantial efforts in terms of, e.g., measuring devices, measurement analyzing devices, circuitry, etc. For example, electrical resistances have to be included, measured and compared within circuitry comprising cords of a suspension member in order to thereby enable quantitative measurements of the electrical resistance or impedance of the cords.

As explained in more detail in the "applicants prior art", it has been found that measuring electrical resistance/conductivity of cords, particularly measuring quantitatively such characteristics, is not necessary in order to obtain sufficient information about a deterioration state of a load bearing capacity in a suspension member to ensure safe operation of an elevator.

As an alternative approach to conventional methods and devices, it was therefore proposed to not necessarily measure any electrical resistance, resistivity or impedance within conductive cords of a suspension member directly but to provide for a method and a device which allow for deriving sufficient information about a deterioration state by measuring one or more electric voltages which at least relate to a correlation of electric voltages occurring at ends of two groups of cords of the suspension member when alternating voltages are applied to opposite ends of these two groups of cords.

In such alternative approach, electrical resistances, resistivities or impedances do neither have to be known quantitatively on an absolute scale nor in a relative manner. Instead, it may be sufficient to simply measure electric voltages, particularly sums of electrical voltages and/or differences of electrical voltages, without having any detailed knowledge about actual resistances, resistivities and/or impedances through the cords of the suspension member.

As explained in further detail in the "applicants prior art", such alternative approach relies on a principle of applying alternating voltages to different cords or groups of cords in a suspension member arrangement and monitoring a neutral point voltage occurring at an electrical interconnection of opposing ends of these cords or groups of cords. Particularly, in a preferred implementation which is also applicable to embodiments of the present invention, the first and second alternating voltages $U_1$, $U_2$ may have same waveforms and a phase difference of substantially 180°.

While the "applicant's prior art" presents details on principles of such alternative approach, specific embodiments presented in the "applicant's prior art" have now been further developed and are presented herein.

Expressed in a simpler wording than in the claims, but without restricting the scope of the claims, ideas underlying embodiments of the inventive method and device in accordance with the claims presented herein may be briefly summarized as follows:

In the embodiments described in the "applicant's prior art", first and second alternating voltages generated by first and second voltage generators have been applied at first ends of each of the groups of cords and voltages have been measured between opposite second ends of each of the groups of cords and a reference potential. Accordingly, in such approaches, both ends of the suspension member have to be electrically contacted in order to, on the one side, apply the alternating voltages to the first ends and, on the other side, measure voltages at the second ends.

However, it has been found that such electrically contacting at both ends of the suspension member may generate substantial complexity in a circuitry for deterioration state detection.

Briefly summarized, it is therefore proposed herein to modify the prior approaches such that the suspension member(s) need to be contacted only at one of their ends. Particularly, it is proposed to apply the first and second alternating voltages to a proximal end of a first one and to a proximal end of a second one out of at least three groups of electrically conductive cords and to use the third group of cords for electrically connecting the distal ends of these first and second groups back to the detection device.

For that purpose, the distal ends of the first, second and third group of cords are electrically short-circuited, i.e. interconnected with each other, via a bridge interconnector having a negligible electrical resistance compared to the electrical resistances throughout the groups of cords. Accordingly, the distal ends of the first and second groups of cords are both electrically connected to the distal end of the third group of cords such that a so-called neutral point voltage occurring between these distal ends of the first and second groups of cords may be measured through the third group of cords by connecting the proximal end of the third group of cords to the voltage measurement arrangement. Accordingly, both, the alternating voltage generator arrangement comprising the two voltage generators as well as the voltage measurement arrangement for measuring the neutral point voltages may be comprised in a single detection device and may be connected to the first, second and third group of cords, respectively, only at the proximal ends of the suspension members. Thereby, a complexity of the circuitry of the detection device and its electrical connections to the suspension member arrangement may be significantly reduced.

According to an embodiment of the elevator arrangement of the third aspect of the invention, distal ends of the first, a second and a third group of electrically conductive cords are electrically connected to each other via a bridge interconnector and proximal ends of the first, a second and a third group of electrically conductive cords are electrically connected to the multiplexer unit of the detection device.

Accordingly, the detection device comprising the multiplexer unit may be easily electrically contacted to the cords in the suspension member arrangement as for example electrical contacts between the multiplexer unit and the cords have to be established only at the proximal ends of the suspension members whereas the distal ends do not have to be contacted by the detection device.

However, as in such arrangement, the first and second alternating voltages would only be applied to the first and second groups of cords, thereby allowing detecting any deteriorations only in those two groups of cords, it is proposed to additionally apply a multiplexing unit. Such multiplexing unit shall be configured for selectively connecting two of the proximal ends of the groups of cords to the first and second voltage generators, respectively, and for selectively connecting a third one of the proximal ends of the groups of cords to the voltage measurement arrangement. Therein, the multiplexing unit may switch between various configurations such that the alternating voltages may sequentially be applied to different ones of the groups of cords and neutral point voltages may be measured such as to detect deteriorations sequentially throughout all of the groups of cords.

According to an embodiment, the multiplexing unit is switched multiple times into various configurations such that the first and second alternating voltages $U_1$, $U_2$ are applied at least once to each of the proximal ends of all groups of electrically conductive cords and a neutral point voltage $U_n$ is determined at least once between each of the proximal ends and the electrical reference potential, respectively.

In other words, in an example where there are only three groups of cords, the multiplexing unit may, in an initial configuration, connect the first and second alternating voltages to the proximal ends of the first and second groups of cords and measure the neutral point voltage via the third group. Then, the multiplexing unit may switch to a modified configuration in which the first and second alternating voltages are applied to the proximal ends of the second and third group and the neutral point voltage is measured via the first group of cords. Then, the multiplexing units may be again switched to another modified configuration in which the first and second alternating voltages are applied to the proximal ends of the third and first group and the neutral point voltage is measured via the second group. Then, the multiplexing unit may be set to its initial configuration and the entire sequence may be repeated. Accordingly, after completing one such sequence, the neutral point voltages have been measured for all possible voltage application configurations to each of the groups of cords such that deteriorations may be detected in each of the groups of cords.

Of course, in real suspension member arrangements, there may be more than three groups of cords and, accordingly, there may be more than three possible configurations in the multiplexing unit. Generally, the number of possible configurations in the multiplexing unit should correspond to, or be larger, than the number of groups of cords.

According to an embodiment, each of the groups of cords comprises several cords comprised in a same suspension member. In other words, while a suspension member arrangement of an elevator typically comprises several suspension members, i.e. several belts or ropes commonly bearing the loads within the elevator, for the approach described herein, it may be beneficial that each of the groups of cords comprises only cords included in a single suspension member. Again in other words, a group of cords should advantageously not comprise cords included in different suspension members. For example, a group of cords may comprise all the cords included in a single suspension member. Alternatively, the cords included in a single suspension member may be divided into two or more groups of cords.

According to an embodiment, each of the groups of cords comprises several cords directly neighboring to each other. In other words, a group of cords comprised in a suspension member should preferably only comprise cords which are directly neighboring each other, i.e. no cords of another group of cords should be interposed.

Such configuration may be in contrast to prior configurations such as those described in the "applicant's prior art", in which a first group of cords comprises for example all even numbered cords within a suspension member whereas a second group of cords comprises all odd numbered cords in this suspension member. While such prior configuration may have some advantages, it has been found that contacting the ends of the cords for establishing electrical connections to the voltage generators and/or to the voltage measurement arrangement may be complicated in cases where only every second cord within a suspension member is to be contacted. Particularly, it has been found that it may be difficult to precisely align external contacts with the cords comprised in the suspension member such that, upon introducing the external contacts into the suspension member, they precisely and reliably contact only intended cords while not contacting for example intermediate cords of another group of cords.

Therefore, it is proposed that a group of cords should preferably only comprise neighboring cords such that external contacts may easily contact each of these cords of the group without risking contacting any intermediate cords of another group.

For example, according to an embodiment, the bridge interconnector used in the elevator arrangement for interconnecting the distal ends of the cords of the various groups of cords may comprise a multiplicity of needle contacts to be introduced into the suspension member at closely neighboring positions such as to electrically contact the cords in the suspension member. Therein, the needle contacts may be short-circuited with each other.

In other words, cords of a group of cords may be interconnected with each other as well as, optionally, with cords of another group of cords at the distal end of the suspension member using a bridge interconnector which comprises multiple needle contacts short-circuited with each other. The needle contacts may be needles made from an electrically conductive material such as a metal. The needle contacts may have a pointed tip such that they may be easily introduced into an end of a suspension member in order to contact the cords comprised therein. The needle contacts may be spaced from each other at small distances, preferably at distances equal or smaller than distances between neighboring cords in the suspension member. The needle contacts may extend from a backbone or base body in parallel directions, i.e. in a comb-like configuration.

According to an embodiment, in the groups of cords, several cords are electrically connected in parallel. In other words, instead of serially connecting several cords comprised in one of the groups such as to form for example a single elongate electrical conductor, as was the case in the "applicant's prior art" approaches, it is suggested to electrically interconnect some or all of the cords of one group in a parallel configuration. In such parallel configuration, the cords of the suspension member may be easily interconnected using for example the above-mentioned bridge interconnector or any other type of parallel interconnector.

According to an embodiment, the suspension member arrangement comprises at least two suspension members. In such case, each suspension member may comprise exactly two of the groups of electrically conductive cords, wherein the two groups of electrically conductive cords comprised in a common suspension member are electrically short-circuited at their distal ends and wherein the distal ends of the at least two suspension members are electrically short-circuited.

In other words, as, in most cases, the suspension member arrangement comprises more than one suspension member, it appears to be beneficial to divide the cords comprised in one suspension member into two groups and to short-circuit the two groups at their distal ends. Furthermore, the distal ends of the suspension members may be electrically connected to each other and may thereby be short-circuited. Accordingly, all of the groups of cords comprised in the suspension member arrangement are electrically connected to each other at their distal ends such that a voltage applied to the proximal end of a first one of the groups of cords is further transmitted and applied to the distal ends of all of the other groups of cords as long as no deterioration or even interruption occurred in the first group of cords. Such short-circuited configuration at the distal ends allows both, applying the first and second alternating voltages as well as measuring the resulting neutral point voltages at respective proximal ends of three or more groups of cords.

It shall be noted that possible features and advantages of embodiments of the invention are described herein partly with respect to a method for detecting a deterioration state in a suspension member arrangement and partly with respect to a detection device which is adapted for performing or controlling such method in an elevator. One skilled in the art will recognize that the features may be suitably transferred from one embodiment to another, i.e. from the method to the device or vice versa, and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

The figures are only schematic representations and are not to scale. Same reference signs refer to same or similar features throughout the figures.

DETAILED DESCRIPTION

Figure 1:
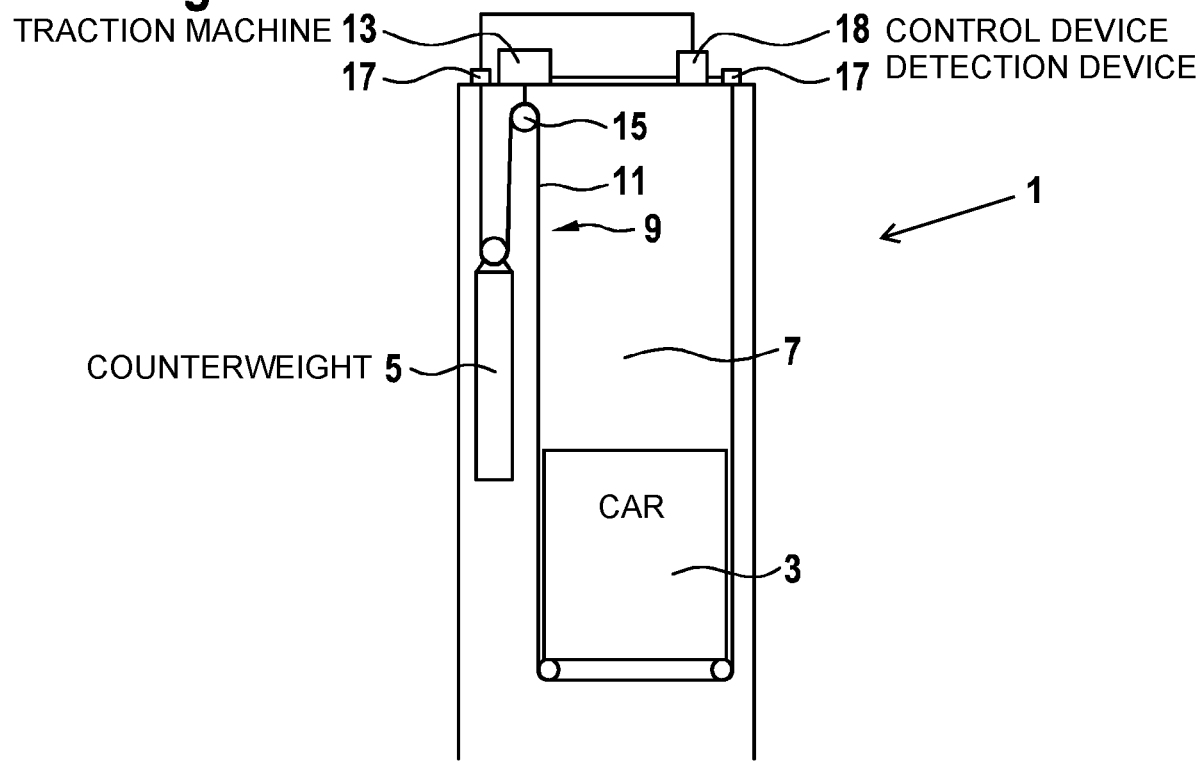
FIG. 1 shows an elevator in which a method according to an embodiment of the invention may be applied.

FIG. 1 shows an elevator 1 in which a method according to embodiments of the present invention may be implemented.

The elevator 1 comprises a car 3 and a counterweight 5 which may be displaced vertically within an elevator shaft 7. The car 3 and the counterweight 5 are suspended by a suspension member arrangement 9. This suspension member arrangement 9 comprises one or more suspension members 11, sometimes also referred to a suspension traction media (STM). Such suspension members 11 may be for example ropes, belts, etc. In the arrangement shown in FIG. 1, end portions of the suspension members 11 are fixed to a supporting structure of the elevator 1 at a top of the elevator shaft 7. The suspension members 11 may be displaced using an elevator traction machine 13 driving a traction sheave 15. An operation of the elevator traction machine 13 may be controlled by a control device 18. For example at opposite end portions of the suspension member arrangement 9 components of a device 17 for detecting a deterioration state in the suspension member arrangement 9 may be provided.

It may be noted that the elevator 1 and particularly its suspension member(s) 11 and its device 17 for detecting the deterioration may be configured and arranged in various other ways than those shown in FIG. 1.

The suspension members 11 to be driven for example by the traction machine 13 may utilize metal cords or ropes to support a suspended load such as the car 3 and/or the counterweight 5 that is moved by the traction machine 13.

Figure 2:
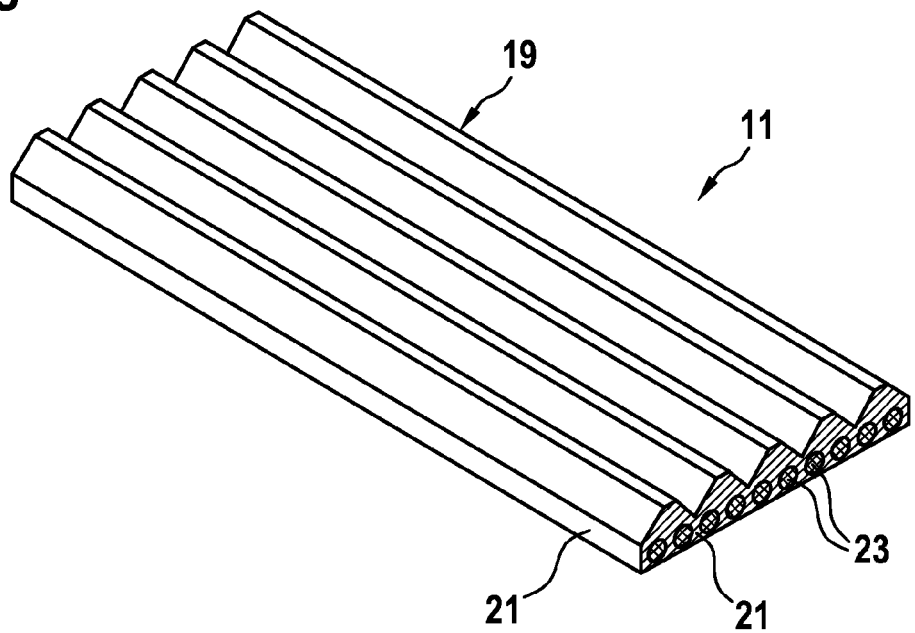
FIG. 2 shows a suspension member.

FIG. 2 shows an example of a suspension member 11 which is embodied with a belt 19. The belt 19 comprises a plurality of cords 23 which are arranged parallel to and spaced from each other. The cords 23 are enclosed in a matrix material 21 forming, inter alia, a coating. Such coating may mechanically couple neighboring cords 23. The coating may have a textured or profiled surface including longitudinal guiding grooves. The cords 23 may typically consist of or comprise wires made from a metal such as steel. The matrix material 21 may consist of or comprises a plastic or elastomeric material. Accordingly, the cords 23 are typically electrically conductive such that an electric voltage may be applied to and/or an electric current may be fed through the cords without significant losses. Furthermore, the cords 23 are preferably electrically isolated from each other via the interposed electrically insulating matrix material 21 such that, as long as an integrity of the coating is not deteriorated, an electrical current or voltage between neighboring cords cannot be transmitted, i.e. no significant shunt current can flow from one cord 23 to another.

Alternatively, suspension members 11 may have other shapes or configurations. For example, a belt may have several cords included into a body formed of matrix material, the body being non-profiled (i.e. flat) or having other shapes as those shown in FIG. 2. Alternatively, each cord may be enclosed by matrix material forming a kind of coating wherein the coated cords are separate from each other, i.e. not connected to each other via common matrix material. Generally, the suspension members 11 may be provided as coated steel suspension members.

Typically, wires or cords of the suspension member 11 have a specified minimum strength to ensure an integrity of the suspension member arrangement 9 during its use in an application within an elevator 1. In certain suspension applications, such as for lifts or elevators, a factor-of-safety requirement for strength combined with other measures, such as protective coating of the cords 23 for example within the matrix material 21, may sustain an initial strength of a suspension member beyond an effective life of the protective measures employed to retain strength.

Particularly in such cases, where the initial strength of the suspension member 11 is not expected to change during its useful life in an application, a simple electronic method may be employed and may be sufficient to detect an indication that for example initial physical properties of the suspension members have unexpectedly changed and trigger for example a replacement of the suspension member 11 or other counter-measures.

Figure 3:
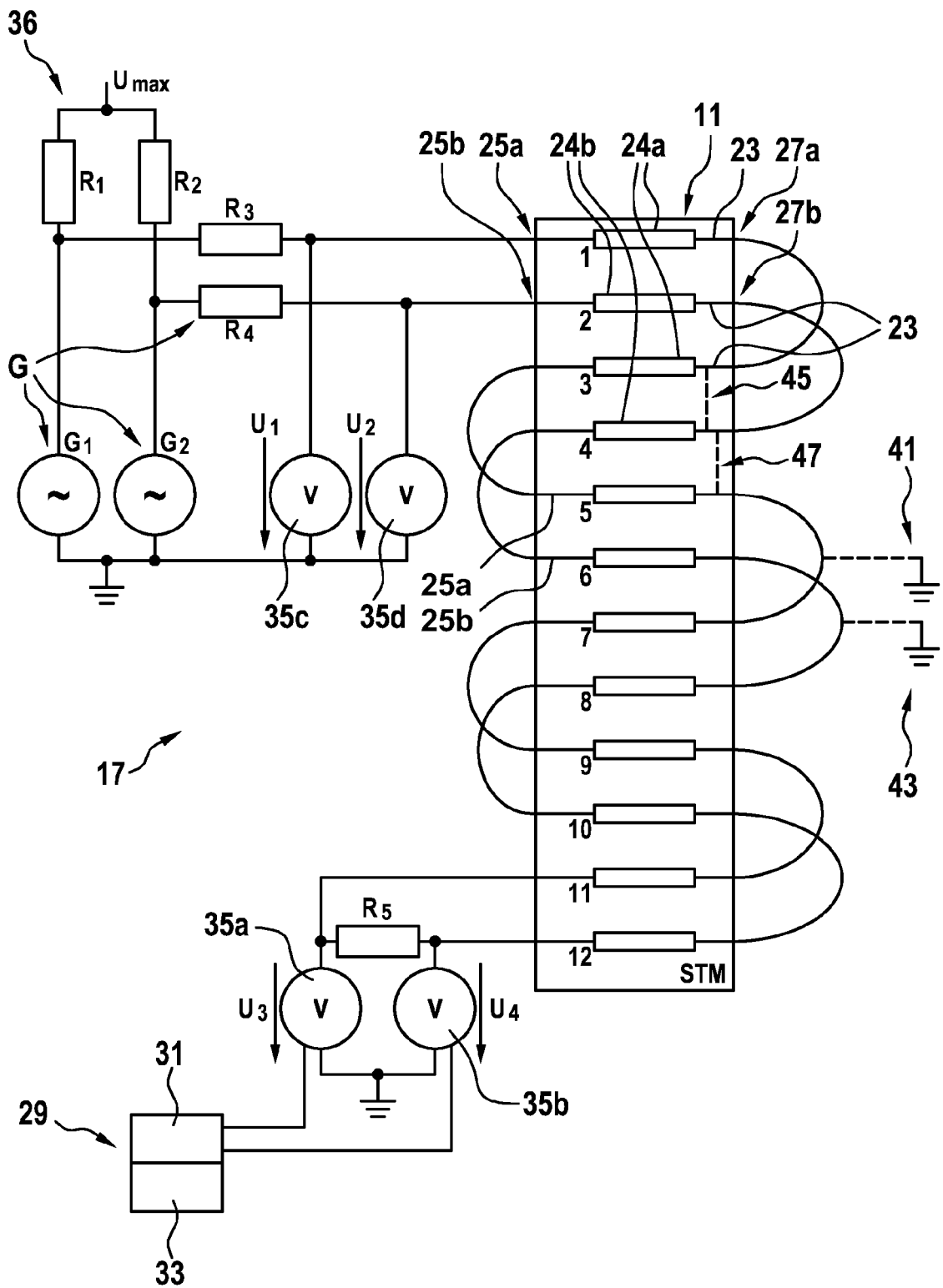
FIG. 3 shows a measurement arrangement to be applied in a method for detecting the deterioration state in the suspension member arrangement according to an embodiment of the applicant's prior art.

FIG. 3 shows an exemplary embodiment of a device 17 as described in the "applicant's prior art". Details on function principles of the device 17 and the deterioration detection method performed therewith may be obtained from the "applicant's prior art" and will not be repeated in detail herein for the sake of briefness.

The device 17 is configured for detecting a deterioration state in a suspension member arrangement 9 for an elevator 1. Therein, the suspension member arrangement 9 may comprise one or more suspension members 11 such as for example belts as shown in FIG. 2 including a plurality of electrically conducting cords 23. In FIG. 3, the cords 23 are only indicated schematically as twelve elongate cords 23 being arranged parallel to each other. The multiplicity of cords 23 may be divided into two groups 24a, 24b of cords.

In the "applicant's prior art" approach, a first group 24a of cords may comprise all odd numbered cords 23 whereas a second group 24b of cords may comprise all even numbered cords 23. Alternating voltages $U_1$, $U_2$ are applied from two voltage generators $G_1$, $G_2$ to a proximal end 25a of an uppermost cord (numbered "1") of the first group 24a of cords and to a proximal end 25b of an adjacent cord (numbered "2") of the second group 24b of cords. Distal ends 27a, 27b of these cords are then electrically connected to the next two cords (numbered "3" and "4"), respectively. Proximal ends 25a, 25b of these cords are again electrically connected to the next two cords (numbered "5" and "6"), and so on.

However, with such series connections and intermittent arrangement of cords of the first and second groups 24a, 24b of cords, interconnecting the alternating cords 23 of the first and second groups, respectively, at their proximal and distal ends 25a, 25b, 27a, 27b requires precise alignment of any interconnectors and may therefore be complicated and prone to errors.

Figure 4:
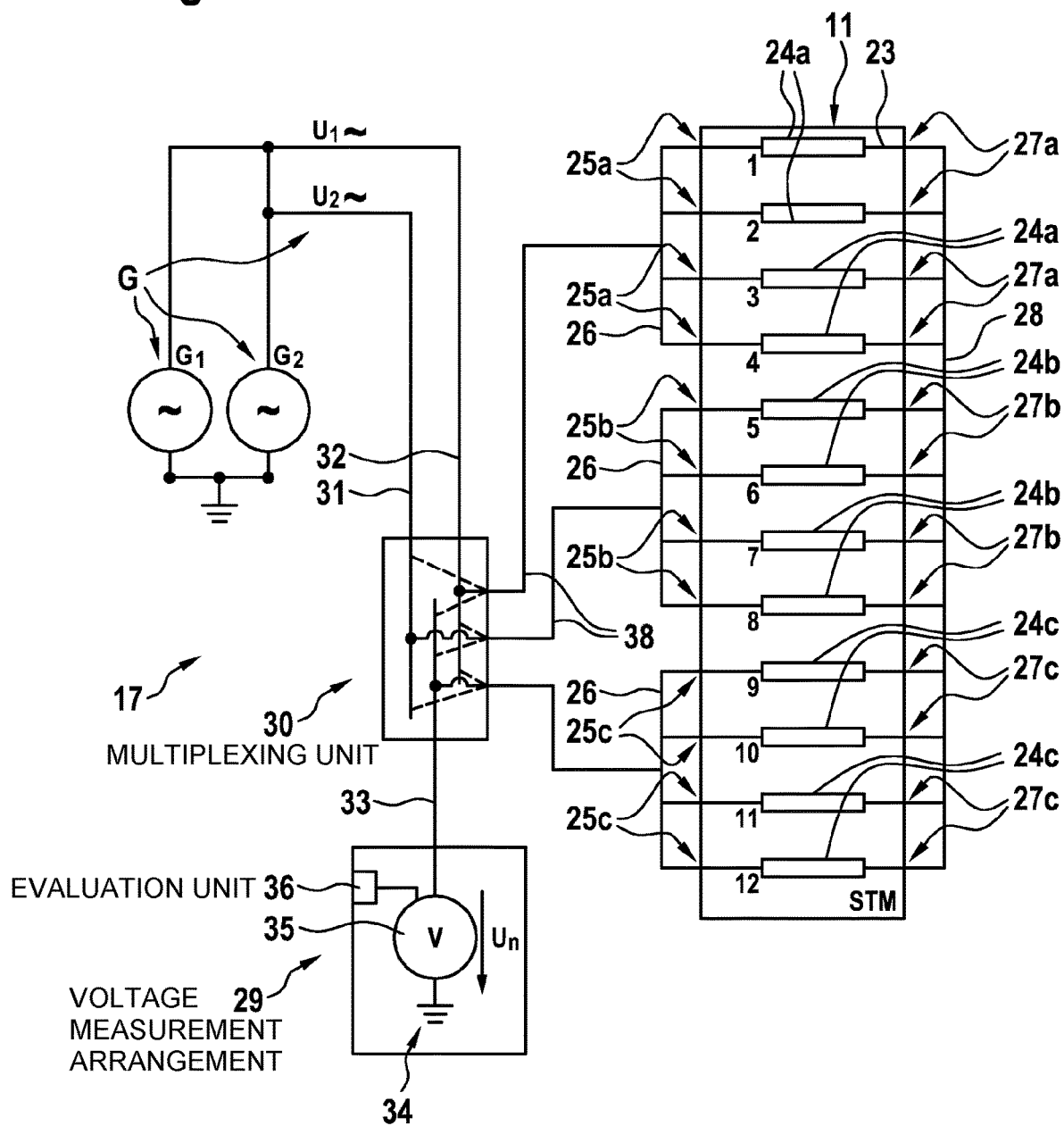
FIG. 4 shows major components of a measurement arrangement to be applied in a method for detecting the deterioration state in the suspension member arrangement according to an embodiment of the present invention.

In order to overcome interconnection issues, an alternative measurement arrangement as shown in FIG. 4 is proposed herein. In FIG. 4, only some relevant components and features of such measurement arrangement detection device 17 and a suspension member 11 are shown. Particularly, a voltage measurement arrangement 29 is represented only as a rough scheme and details of such voltage measurement arrangement 29 are omitted for the sake of simplicity of representation. Furthermore, features such as those described in the "applicant's prior art" may also be applied to the measurement arrangement of FIG. 4 but are not shown for the sake of simplicity of representation.

Similarly to the approach shown in FIG. 3, an alternating voltage generator arrangement G comprises a first and a second voltage generators $G_1$, $G_2$ which generate first and second alternating voltages $U_1$, $U_2$ preferably having a same waveform, i.e. a same amplitude and same time profiles, but which are shifted by 180° with respect to each other.

In contrast to the approach shown in FIG. 3, the cords 23 in the suspension member 11 are not only divided into two groups but into three groups 24a, 24b, 24c. It shall be noted that the three groups of cords are not necessarily included in a single suspension member 11 but may be included in 2 or 3 suspension members 11 of a suspension member arrangement 9. Furthermore, more than three groups of cords may be comprised in the suspension member arrangement and may be distributed among one or a plurality of suspension members, such that each suspension member comprises one, two or more groups of cords.

Furthermore, in contrast to the approach shown in FIG. 3, each of the groups 24a, 24b, 24c comprises cords 23 directly neighboring each other. In the example shown, four cords 23 are included in each one of the groups 24a, 24b, 24c.

Therein, the cords 23 of one of the groups 24a, 24b, 24c are electrically connected in parallel. For such purpose, a parallel connector 26 may electrically connect proximal ends 25a, 25b, 25c of each of the groups 24a, 24b, 24c, respectively. Distal ends 27a, 27b, 27c of each of the groups 24a, 24b, 24c are also electrically connected in parallel. Furthermore, the groups 24a, 24b, 24c are short-circuited, i.e. electrically interconnected with each other, at their distal ends 27a, 27b, 27c. For such purpose, a short-circuit connector 28 may interconnect all of the cords 23 of all of the groups 24a, 24b, 24c.

In contrast to the approach shown in FIG. 3, the voltage generator arrangement G is not statically electrically connected to the three groups 24a, 24b, 24c of cords 23 in the suspension member 11. Instead, the detection device 17 comprises a multiplexing unit 30. This multiplexing unit 30 may connect each of the two voltage generators $G_1$, $G_2$ to the proximal ends 25a, 25b, 25c of one of the groups 24a, 24b, 24c of cords 23. Furthermore, the multiplexing unit 30 may selectively connect the voltage measurement arrangement 29 to the proximal ends 25a, 25b, 25c of one of the groups 24a, 24b, 24c of cords 23.

For such purpose, the multiplexing unit 30 comprises internal switches for selectively connecting electrical connections 31, 32 to the voltage generators $G_1$, $G_2$ and an electrical connection 33 to the voltage measurement arrangement 29, on the one hand, to electrical connections 38 to the proximal ends 25a, 25b, 25c of one of the groups 24a, 24b, 24c of cords 23.

In the example shown in FIG. 4, the multiplexer unit 30 is shown in a configuration, in which the first voltage generator $G_1$ is connected to the proximal ends 25a of the first group 24a of cords, the second voltage generator $G_2$ is connected to the proximal ends 25b of the second group 24b of cords and the voltage measurement arrangement 29 is connected to the proximal ends 25c of the third group 24c of cords. In such configuration, the first and second alternating voltages $U_1$, $U_2$ will be transmitted through the cords 23 of the first group 24a and of the second group 24b, respectively. As distal ends 27a, 27b of both groups 24a, 24b are electrically interconnected, a neutral point voltage $U_n$ applies at the interconnection of these distal ends.

As long as both groups 24a, 24b of cords 23 are substantially identical with respect to their electrical characteristics, particularly with respect to their electrical resistances, such neutral point voltage $U_n$ will have substantially no AC component as the applied first and second alternating voltages $U_1$, $U_2$ have identical waveforms and include a phase shift of 180°. However, upon any changes to the electrical characteristics occurring in one of the groups 24a, 24b of cords, such balanced situation is modified such that the neutral point voltage $U_n$ generally includes an AC component. As such changes in the electrical characteristics typically result from deteriorations of the cords 23 in the suspension members 11, the presence and/or characteristics of such AC component may be interpreted as indicating such deteriorations.

In order to be able to measure the neutral point voltage $U_n$ by electrically contacting the suspension member 11 at its proximal end, the short-circuited interconnector 28 not only interconnects the first and second groups 24a, 24b of cords but also establishes a bridge interconnection to the distal end 27c of the third group 24c of cords. Accordingly, the neutral point voltage $U_n$ is further transmitted towards the proximal end 25c of this third group 24c of cords. This proximal end 25c is then connected via the multiplexer unit 30 to the voltage measurement arrangement 29 and such that the neutral point voltage $U_n$ may be measured by the voltmeter 35 comprised therein with respect to a reference potential 34 such as a ground potential.

The neutral point voltage $U_n$ may then be evaluated in the evaluation unit 36. For example, the evaluation unit 36 may detect whether or not the neutral point voltage $U_n$ comprises an AC component and may, optionally, analyze a magnitude and/or type of the AC component. Particularly, the evaluation unit 36 may evaluate neutral point voltages $U_{n1}$, $U_{n2}$ measured in various configurations of the multiplexing unit 30, i.e. upon the alternating voltages $U_1$, $U_2$ being applied to various ones of the groups of cords. Based on such evaluation, a signal may be issued indicating the deterioration state of the suspension member arrangement 11. For example, such signal may be transmitted to a remote monitoring center.

Figure 5:
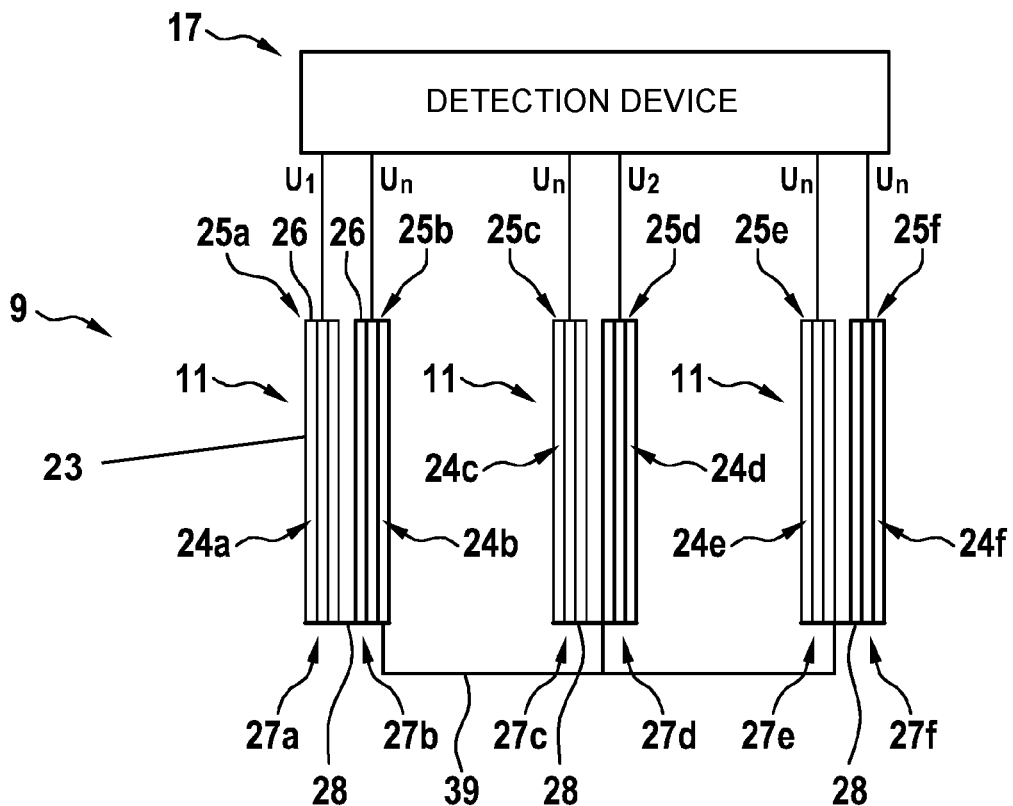
FIG. 5 very schematically shows another measurement arrangement to be applied in a method for detecting the deterioration state in the suspension member arrangement according to another embodiment of the present invention.

FIG. 5 schematically represents another example of a measurement arrangement comprising a detection device 17 and the suspension member arrangement 9. Therein, the suspension member arrangement 9 comprises three suspension members 11. Each of the suspension members 11 comprises two groups 24a-f of cords 23. Each of the groups 24a-f comprises four cords 23. The cords 23 are connected in parallel by parallel connectors 26 connecting their proximal ends 25a-f and by the bridge interconnectors 28 connecting their distal ends 27a-f. Therein, while the parallel connectors 26 connect only the cords 23 of one of the groups 24a-f, the bridge interconnector 28 connects the cords 23 of all cords 23 comprised in both groups comprised in a single suspension member 11.

Furthermore, in the suspension member arrangement 9 comprising several suspension members 11, the suspension members 11 are interconnected at their distal ends with an overall interconnector 39. Such overall interconnector 39 may be e.g. a cable electrically interconnecting the bridge interconnectors 28 at the distal ends of each of the suspension members 11.

In the exemplary configuration shown in FIG. 5, the multiplexer unit 30 (not shown in this figure) is temporarily configured such that the first alternating voltage $U_1$ is applied to the first group 24a of cords including half of the cords 23 comprised in the first suspension member 11 whereas the second alternating voltage $U_2$ is applied to the fourth group 24d of cords including half of the cords 23 comprised in the second suspension member 11. In such configuration, all other groups 24b, 24c, 24e, 24f of cords to which presently no alternating voltage is applied may be used as electrical back connections through which the neutral point voltage $U_n$ may be supplied to the voltage measurement unit (not shown in this figure) of the detection device 17.

Figure 6:
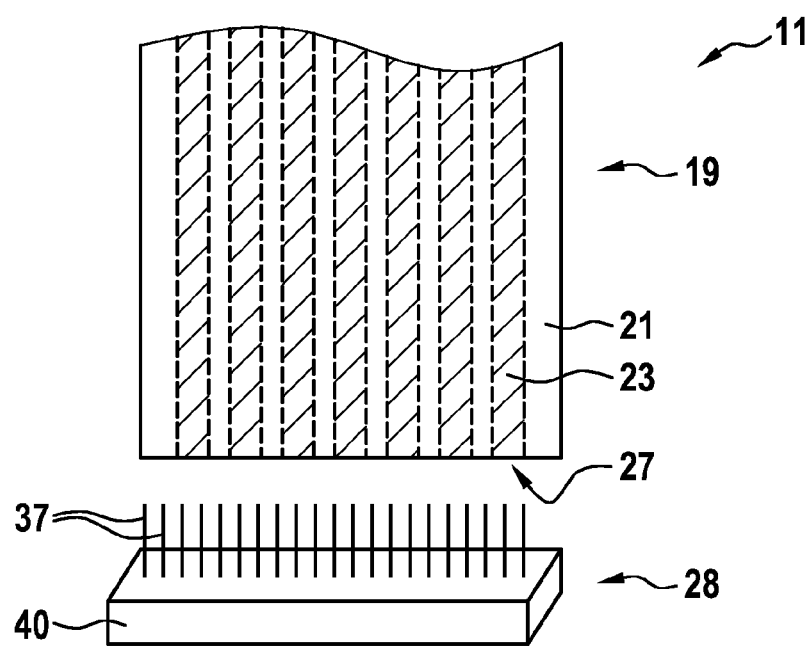
FIG. 6 shows a bridge interconnector to be applied in an elevator arrangement according to an embodiment of the present invention.

FIG. 6 shows an example of a bridge interconnector 28 for electrically interconnecting the cords 23 comprised in a belt 19 forming a suspension member 11. The bridge interconnector 28 comprises a base body 40 and several needle contacts 37. The base body 40 electrically interconnects the needle contacts 37. For example, the base body 40 and/or the needle contacts 37 may be made from metal and, optionally, may form an integral device. The needle contacts 37 may extend in parallel directions and may be spaced from each other by distances being equal to or smaller than lateral distances between neighboring cords 23 in the belt 19. Furthermore, the needle contacts 37 may have a length sufficient for reliably contacting the cords 23 in the belt 19 upon the bridge interconnector 28 being pressed onto the distal end 27 of the belt 19.

Finally, it should be noted that terms such as "comprising" do not exclude other elements or steps and that terms such as "a" or "an" do not exclude a plurality. Also elements described in association with different embodiments may be combined.

In accordance with the provisions of the patent statutes, the present invention has been described in what is considered to represent its preferred embodiment. However, it should be noted that the invention can be practiced otherwise than as specifically illustrated and described without departing from its spirit or scope.

LIST OF REFERENCE SIGNS 1 elevator
3 car 5 counterweight
7 elevator shaft
9 suspension member arrangement
11 suspension member
13 traction machine
15 traction sheave
17 detection device for detecting deterioration states
18 control device
19 belt
21 matrix material
23 cords
24a first group of cords
24b second group of cords
24c third group of cords
25a proximal end of first group of cords
25b proximal end of second group of cords
25c proximal end of third group of cords
26 parallel interconnector
27a distal end of first group of cords
27b distal end of second group of cords
27c distal end of third group of cords
28 bridge interconnector
29 voltage measurement arrangement
30 multiplexing unit
31 electrical connection to first voltage generator
32 electrical connection to second voltage generator
33 electrical connection to voltage measurement arrangement
34 reference potential
35 voltmeter
36 evaluation unit
37 contact needles of bridge interconnector
38 electrical connection to group of cords
39 overall interconnector
40 base body of bridge interconnector
$U_1$ first alternating voltage
$U_2$ second alternating voltage
$U_n$ neutral point voltage
G alternating voltage generator arrangement
$G_1$ first alternating voltage generator
$G_2$ second alternating voltage generator

The invention claimed is:

1. A method for detecting a deterioration state in a suspension member arrangement for an elevator, the suspension member arrangement including a suspension member having first, second and third groups of electrically conductive cords, the method comprising the steps of:
proving a multiplexing unit for selectively connecting proximal ends of the cords in two of the first, second and third groups to an alternating voltage generator arrangement having a first voltage generator for applying a first alternating voltage and a second voltage generator for applying a second alternating voltage, and for selectively connecting proximal ends of the cords in a third of the first, second and third groups to a voltage measurement arrangement for determining voltages between the connected third proximal ends and an electrical reference potential;
electrically connecting distal ends of the cords in the first, second and third groups to each other via a bridge interconnection;
switching the multiplexing unit into a first configuration thereby applying the first alternating voltage to the proximal ends of the first group and applying the second alternating voltage to the proximal ends of the second group, and determining a first neutral point voltage between the proximal ends of the third group and the electrical reference potential;
switching the multiplexing unit from the first configuration into a second configuration thereby applying the first alternating voltage to the proximal ends of the second group and applying the second alternating voltage to the proximal ends of the third group, and determining a second neutral point voltage between the proximal ends of the first group and the electrical reference potential; and
detecting the deterioration state of the suspension member arrangement based on the first and second neutral point voltages.

2. The method according to claim 1 including switching the multiplexing unit multiple times into various configurations such that the first and second alternating voltages are applied at least once to each of the proximal ends of all of the groups and determining a neutral point voltage at least once between each of the proximal ends and the electrical reference potential respectively.

3. The method according to claim 1 wherein each of the groups includes several of the cords in the suspension member.

4. The method according to claim 1 wherein each of the groups includes several of the cords directly neighboring to each other.

5. The method according to claim 1 wherein several of the cords in each of the groups are electrically connected in parallel.

6. The method according to claim 1 wherein the first and second alternating voltages have same waveforms and a phase difference of 180°.

7. A detection device for detecting a deterioration state in a suspension member arrangement for an elevator, the suspension member arrangement including a suspension member having a first group, a second group and a third group of electrically conductive cords, wherein distal ends of the cords in the first, second and third groups are electrically connected to each other via a bridge interconnection, the detection device comprising:
an alternating voltage generator arrangement including a first voltage generator for generating a first alternating voltage and a second voltage generator for generating a second alternating voltage;
a voltage measurement arrangement for measuring neutral point voltages between proximal ends of the cords in each one of the first, second and third groups and an electrical reference potential;
a multiplexing unit for selectively connecting the proximal ends of a first one of the first, second and third groups to the first voltage generator, the proximal ends of a second one of the first, second and third groups to the second voltage generator, and the proximal ends of a third one of the first, second and third groups to the voltage measurement arrangement;
an evaluation unit for detecting the deterioration state of the suspension member arrangement based on the measured neutral point voltages; and
wherein the detection device is adapted to perform the steps of
switching the multiplexing unit into a first configuration thereby applying the first alternating voltage to the proximal ends of the first group and applying the second alternating voltage to the proximal ends of the second group, and determining a first neutral point voltage between the proximal ends of the third group and the electrical reference potential, switching the multiplexing unit from the first configuration into a second configuration thereby applying the first alternating voltage to the proximal ends of the second group and applying the second alternating voltage to the proximal ends of the third group, and determining a second neutral point voltage between the proximal ends of the first group and the electrical reference potential, and detecting the deterioration state of the suspension member arrangement based on the first and second neutral point voltages.

8. An elevator arrangement comprising:
a suspension member arrangement including a suspension member having a first group, a second group and a third group of electrically conductive cords; and
a detection device according to claim 7 for detecting a deterioration state in the suspension member arrangement.

9. The elevator arrangement according to claim 8 wherein distal ends of the first, second and third groups are electrically connected to each other via a bridge interconnector and wherein the proximal ends of the first, second and third groups are electrically connected to the multiplexer unit of the detection device.

10. The elevator arrangement according to claim 9 wherein the bridge interconnector includes a plurality of needle contacts introduced into the suspension member at closely neighboring positions to electrically contact the cords in the suspension member, the needle contacts being short-circuited with each other.

11. An elevator arrangement comprising:
a suspension member arrangement including at least two suspension members, each of the at least two suspension members having only two groups of electrically conductive cords;
wherein the cords in the two groups in each of the at least two suspension members are electrically short-circuited at distal ends thereof;
wherein the distal ends of the cords in the at least two suspension members are electrically short-circuited; and a detection device including:
an alternating voltage generator arrangement including a first voltage generator for generating a first alternating voltage and a second voltage generator for generating a second alternating voltage;
a voltage measurement arrangement for measuring neutral point voltages between proximal ends of the cords in each of the groups and an electrical reference potential;
a multiplexing unit for selectively connecting proximal ends of cords in a first of the groups to the first voltage generator, proximal ends of the cords in a second of the groups to the second voltage generator, and proximal ends of all other ones of the groups, as a third group, to the voltage measurement arrangement; and
an evaluation unit for detecting the deterioration state of the suspension member arrangement based on the measured neutral point voltages; and
wherein the detection device is adapted to perform the steps of
switching the multiplexing unit into a first configuration thereby applying the first alternating voltage to the proximal ends of the first group and applying the second alternating voltage to the proximal ends of the second group, and determining a first neutral point voltage between the proximal ends of the third group and the electrical reference potential,
switching the multiplexing unit from the first configuration into a second configuration thereby applying the first alternating voltage to the proximal ends of the second group and applying the second alternating voltage to the proximal ends of the third group, and determining a second neutral point voltage between the proximal ends of the first group and the electrical reference potential, and
detecting the deterioration state of the suspension member arrangement based on the first and second neutral point voltages.

* * * * *